United States Patent
Duan et al.

(10) Patent No.: US 11,212,617 B2
(45) Date of Patent: Dec. 28, 2021

(54) PIEZOELECTRIC MEMS MICROPHONE

(71) Applicant: AAC ACOUSTIC TECHNOLOGIES (SHENZHEN) CO., LTD., Shenzhen (CN)

(72) Inventors: Lian Duan, Shenzhen (CN); Rui Zhang, Shenzhen (CN); Zhiyuan Chen, Shenzhen (CN)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 16/988,733

(22) Filed: Aug. 10, 2020

(65) Prior Publication Data

US 2021/0051409 A1    Feb. 18, 2021

(30) Foreign Application Priority Data

Aug. 16, 2019  (CN) .................. 201910760708.X

(51) Int. Cl.
| | |
|---|---|
| *H04R 7/04* | (2006.01) |
| *H04R 7/24* | (2006.01) |
| *B81B 3/00* | (2006.01) |
| *H04R 17/02* | (2006.01) |

(52) U.S. Cl.
CPC ............... *H04R 7/24* (2013.01); *B81B 3/007* (2013.01); *H04R 7/04* (2013.01); *H04R 17/02* (2013.01); *B81B 2201/0257* (2013.01); *B81B 2203/0127* (2013.01); *B81B 2203/0315* (2013.01); *H04R 2201/003* (2013.01)

(58) Field of Classification Search
CPC ........ H04R 7/06; H04R 17/02; H04R 17/025; H04R 31/003; H04R 2201/003; H04R 2207/023; H04R 2207/025; H04R 7/18; H04R 19/005; B81B 3/0021; B81B 3/0037; B81B 2201/0257; B81B 2203/0118; B81B 2203/0127; B81B 2203/04
See application file for complete search history.

(56) References Cited

U.S. PATENT DOCUMENTS

| | | | |
|---|---|---|---|
| 9,029,963 B2 * | 5/2015 | Sparks | B81B 3/0018 257/416 |
| 9,055,372 B2 * | 6/2015 | Grosh | H01L 41/27 |
| 10,710,874 B2 * | 7/2020 | Frischmuth | H04R 19/02 |

* cited by examiner

*Primary Examiner* — Brian Ensey
(74) *Attorney, Agent, or Firm* — W&G Law Group

(57) ABSTRACT

The present invention provides a piezoelectric MEMS microphone having a base with a cavity, a piezoelectric diaphragm, and a restraining element. The base has a ring base circumferentially forming a cavity, a support column. The piezoelectric diaphragm includes diaphragm sheets each having a fixing end connected to a support column and a free end suspended over the cavity. The restraining element has one end fixedly connected to the free end, the other end connected to the part on the base that is not connected to the fixing end. The piezoelectric MEMS microphone of the invention can constrain the deformation of the diaphragm sheet, thereby improving the resonant frequency of the piezoelectric diaphragm, reducing the noise of the whole piezoelectric MEMS microphone.

19 Claims, 5 Drawing Sheets

PIEZOELECTRIC MEMS MICROPHONE

FIELD OF THE PRESENT DISCLOSURE

The invention relates to the technical field of an electroacoustic conversion devices, in particular to a piezoelectric micro-electromechanical systems (MEMS) microphone.

DESCRIPTION OF RELATED ART

A micro-electromechanical system (MEMS) microphone is an electroacoustic transducer manufactured by a micromachining technology and has the characteristics of small volume, a good frequency response characteristic, low noise and the like. Along with the miniaturization and thinness of electronic devices, the MEMS microphone is widely applied to these devices.

The current MEMS microphone mainly comprises a condenser MEMS microphone and piezoelectric MEMS microphones. Compared with a traditional condenser MEMS microphone, the piezoelectric MEMS microphones have multiple advantages, including waterproof, dustproof, relatively high maximum output sound pressure (AOP) and the like. Different from the structure of a piezoelectric diaphragm of the condenser microphone, the piezoelectric diaphragm of the piezoelectric MEMS microphone is composed of a plurality of diaphragm sheets, one end of each diaphragm sheet is connected with a base; and the other end adopts a cantilever beam structure.

However, due to the residual stress of the piezoelectric MEMS microphone in the process, the diaphragm sheet will have different degrees of edge warping, involution and other deformation, resulting in the attenuation difference of the whole diaphragm sheet in low frequency, which makes its resonance frequency significantly reduced (<10 kHz), the noise of the whole piezoelectric MEMS increases, which can not meet the needs of users.

Therefore, in order to enhance the resonant frequency of the piezoelectric MEMS microphone, it is necessary to provide a new piezoelectric MEMS microphone to improve the overall construction to solve the above problems.

SUMMARY OF THE INVENTION

One of the major objects of the present invention is to provide a piezoelectric MEMS microphone which can constrain the deformation of a diaphragm sheet thereof, thereby improving the resonant frequency of the piezoelectric diaphragm, reducing the noise of the whole piezoelectric MEMS microphone.

Accordingly, the present invention provides a piezoelectric MEMS microphone comprising: a base including a ring base circumferentially forming a cavity; a piezoelectric diaphragm mounted on the base, comprising a plurality of diaphragm sheets each having a fixing end connected to the support column and a free end suspended over the cavity; a restraining element connecting the base and the piezoelectric diaphragm; a support column arranged in the cavity and spaced from the ring base. Wherein, the restraining element has one end fixedly connected to the free end, and another end connected to a part of the base that is not connected to the fixing end.

Further, one end of the restraining element has one end fixedly connected to the free end, and another end connected to the ring base.

Further, the base further comprises a plurality of support beams each having one end fixedly connected to the support column and another end connected to the ring base so as to separate the cavity into a plurality of subcavities.

Further, the restraining element has one end fixedly connected to the free end, and another other end connected to the support beam.

Further, the restraining element is a rigid restraining element.

Further, the restraining element is an elastic restraining element; the restraining element comprises an elastic arm, a protruding part connected to the diaphragm sheet and a fixing column connected to the base; the elastic arm has one end connected to the protruding part, the other end connected to the fixing column.

Further, the elastic arm comprises an arc connecting arm, a first support arm connected to the protruding part and a second support arm connected to the fixing column; the arc connecting arm has one end connected to the first support arm, the other end connected to the second support arm.

Further, each of the diaphragm sheets connects two of the restraining elements, the two ends of the diaphragm sheet facing the ring base side are respectively provided with the restraining element.

Further, a projection profile of the free end in a direction perpendicular to the diaphragm sheet is located within a projection profile of the subcavity in a direction perpendicular to the diaphragm sheet.

Further, the projection profile of the free end in the direction perpendicular to the diaphragm sheet is the same as the projection profile shape of the corresponding subcavity in the direction perpendicular to the diaphragm sheet.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENT

Figure 1:
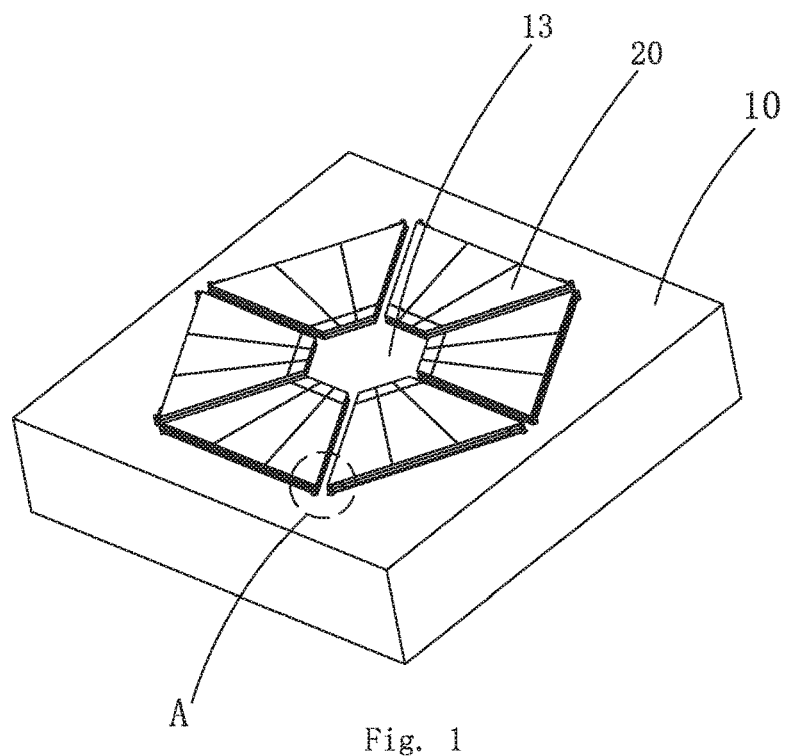
FIG. 1 is an isometric view of a piezoelectric micro-electromechanical systems (MEMS) microphone provided by an embodiment of the invention.

The present disclosure will hereinafter be described in detail with reference to an exemplary embodiment. To make the technical problems to be solved, technical solutions and beneficial effects of the present disclosure more apparent, the present disclosure is described in further detail together with the figure and the embodiment. It should be understood the specific embodiment described hereby is only to explain the disclosure, not intended to limit the disclosure.

What needs to be explained is that all directional indications (Such as upper, lower, inner, outer, top, bottom . . . ) in the embodiment of the invention are only used to explain the relative positional relationship between various components under a certain posture (as shown in the drawings), etc. If the specific posture changes, the directional indication will also change accordingly.

It should also be noted that when an element is referred to as being "fixed" or "disposed" on another element, the element may be directly on the other element or there may be intervening elements at the same time. When an element is called "connected" to another element, it may be directly connected to the other element or there may be intervening elements at the same time.

Referring to FIGS. 1-8, the embodiment of the present invention provides a piezoelectric MEMS microphone. The piezoelectric MEMS microphone comprises a base 10 having a cavity 11 and a piezoelectric diaphragm 20 mounted on the base 10, the piezoelectric diaphragm 20 being located over the cavity 11, an external sound signal is introduced from a sound hole, and the sound pressure causes the piezoelectric diaphragm 20 to deform, generating a voltage change, thereby sensing the acoustic signal.

Figure 2:
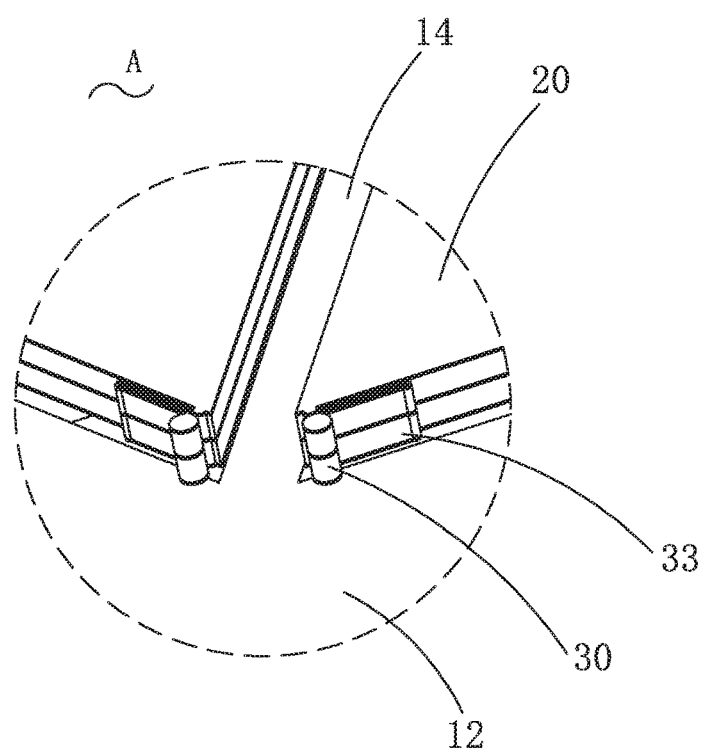
FIG. 2 is a partial enlarged view of Part A in FIG. 1.
Figure 3:
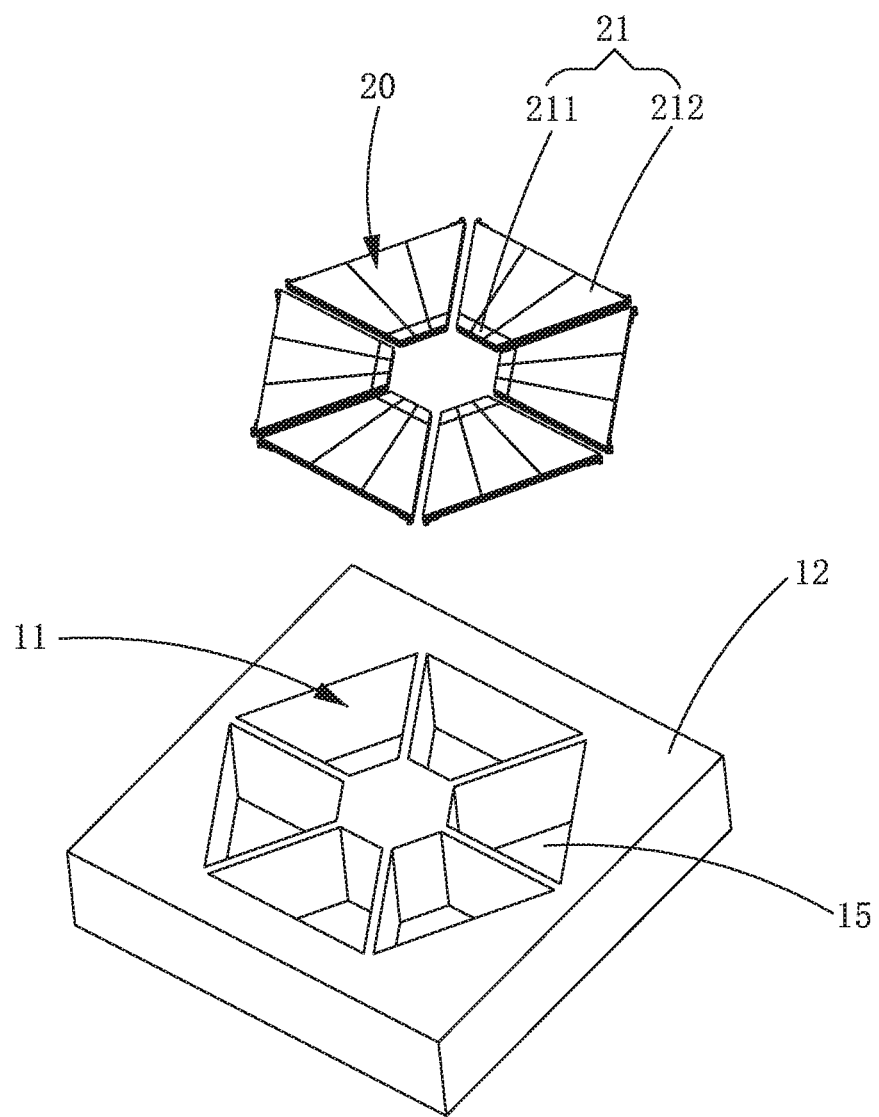
FIG. 3 is an exploded view of the piezoelectric MEMS microphone provided by the embodiment of the present invention.
Figure 4:
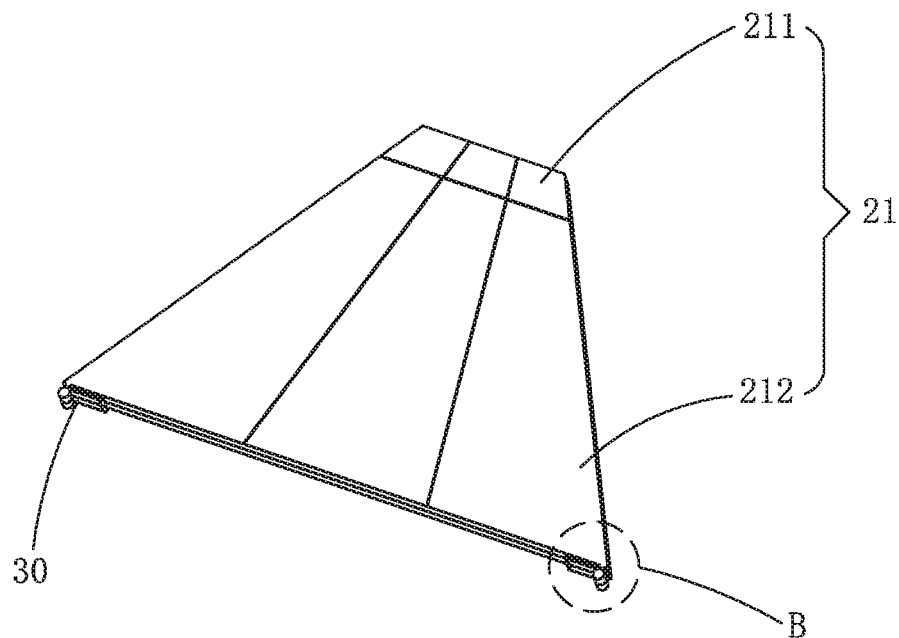
FIG. 4 is an isometric view of the piezoelectric MEMS microphone in which a restraining element is set on a diaphragm sheet.
Figure 5:
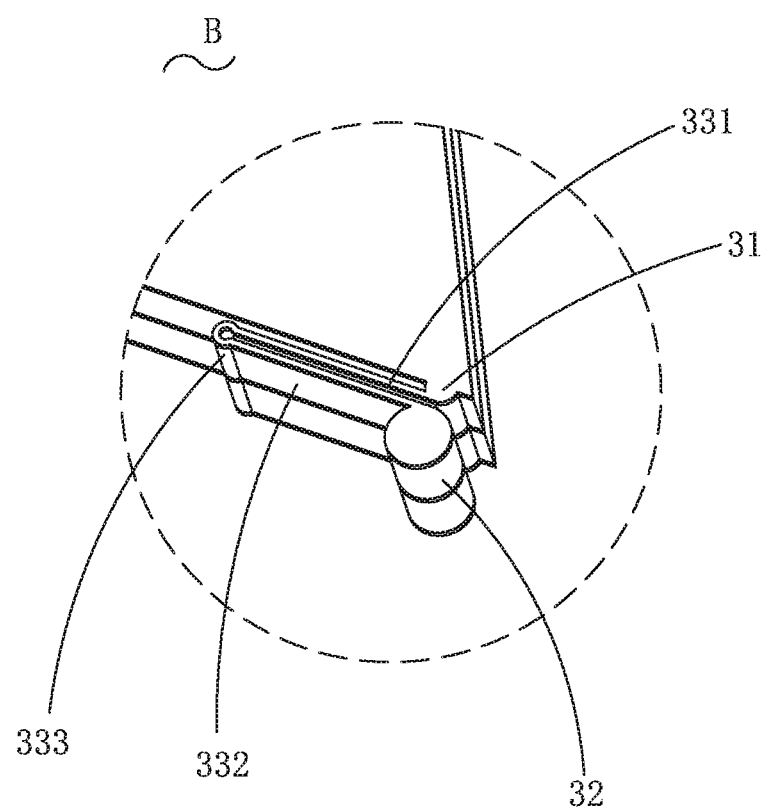
FIG. 5 is a partially enlarged view of Part B in FIG. 4.
Figure 6:
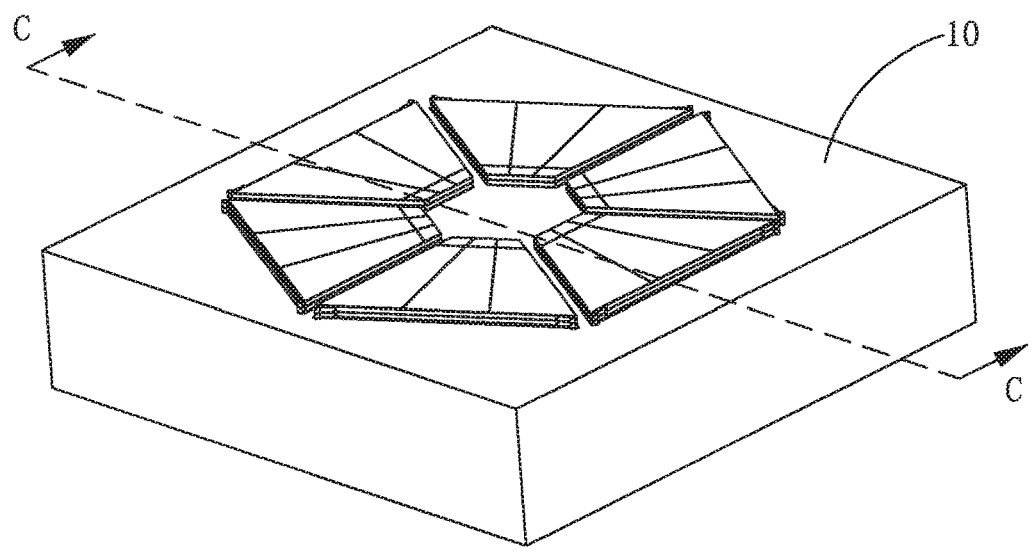
FIG. 6 is a top view of the piezoelectric MEMS microphone provided by the embodiment of the present invention.
Figure 7:
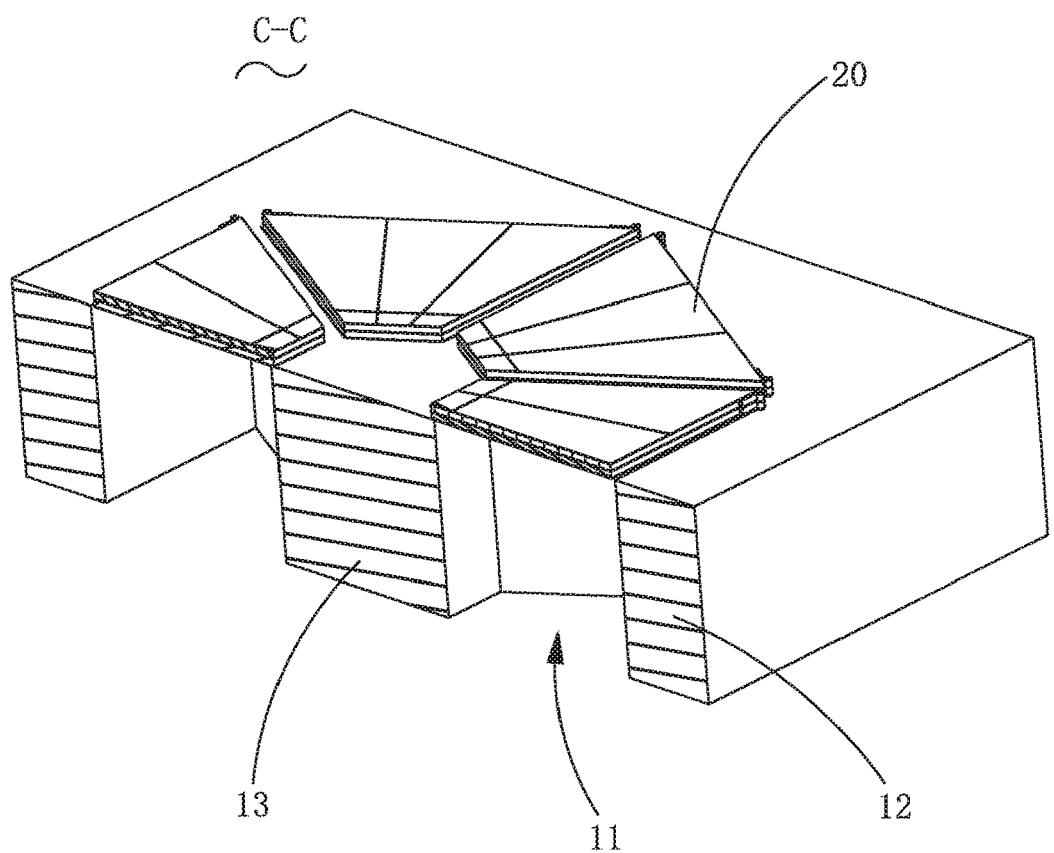
FIG. 7 is a cross-sectional view taken along line C-C in FIG. 6.

Referring to FIGS. 1-3, the base 10 comprises a ring base 12 circumferentially forming the cavity 11, a support column 13 arranged in the cavity 11 and spaced from the ring base 12, and a plurality of support beams 14 arranged at intervals along the circumferential direction of the support column 13. One end of the support beams 14 is connected to the support column 13, the other end of the support beams 14 is connected to a ring base 12 which separates the cavity 11 into several subcavities 15. The ring base 12 in this embodiment may be a 360-degree closed ring or may not be a complete ring.

Referring further to FIGS. 4-7, the piezoelectric MEMS microphone also comprises a restraining element 30 connecting the base 10 and the piezoelectric diaphragm 20. The piezoelectric diaphragm 20 comprises a plurality of diaphragm sheets 21 spaced apart, and the restraining element 30 is connected to the diaphragm sheets 21 and erected over the ring base 12, each diaphragm sheet 21 comprises a fixing end 211 connected to a support column 13 and a free end 212 connected to the fixing end 211 and suspended over the subcavity 15. One end of the restraining element 30 is fixedly connected to the free end 212, the other end of the restraining element 30 is connected to the part of the base 10 that is not connected to the fixing end 211, i.e., the other end of the restraining element 30 can be connected to the ring base 12, or the other end of the restraining element 30 is connected to the support beams 14. The restraining element 30 can avoid the deformation to a different extent of the diaphragm sheet 21 caused by the residual stress in the diaphragm sheet 21, such as edge warping, involution and the like, and prevent the difference in low-frequency attenuation of the diaphragm sheet 21. As a preferred embodiment, each diaphragm sheet 21 is connected to the two restraining elements 30, one restraining elements 30 provided at each end of the diaphragm sheet 21 facing the side of the ring base 12, so that the diaphragm sheet 21 vibrates more smoothly.

The diaphragm sheet 21 is provided extended from the fixing end 211 toward the free end 212 in the form of gradually increasing width dimension (i.e., a circumferential dimension of the diaphragm sheet 21 along support column 13), so that the free end 212 drives the diaphragm sheet 21 to vibrate under the action of the sound pressure. The part of the diaphragm sheet 21 near the fixing end 211 deforms more under the action of the force and generates more electric charge, so its sensitivity can be further improved. In the specific experiment, for the same area of the MEMS chip and film structure without change, this structure design can improve the sensitivity value to more than −35 dB, compared with the −43 dB sensitivity of traditional structure, it has a significant improvement. At the same time, on the side of the free end 212 away from the fixing end 211. A restraint element 30 is provided for constraining the deformation of the diaphragm sheet 21 to further improve the resonant frequency of the piezoelectric diaphragm 20 and reduce the noise of the whole piezoelectric MEMS microphone.

In particular, if the restraining element 30 is a rigid restraining element, the resonant frequency can generally reach above 35 kHz, but the sensitivity is significantly reduced (<−44 dB). You can replace the restraining element 30 here with a rigid restraining element as needed for actual use.

In this embodiment, the restraining element 30 is an elastic restraining element, the restraint element 30 is connected to the ring base 12. The restraining element 30 comprises a protruding part 31, a fixing column 32 and an elastic arm 33. The protruding part 31 is connected to the diaphragm sheet 21, while the fixing column 32 is connected to base 10. Specifically, the fixing column 32 is connected to the ring base 12; one end of the elastic arm 33 is connected to the protruding part 31, and the other end of the elastic arm 33 is connected to a fixing column 32. The elastic arm 33 comprises a first support arm 331, a second support arm 332, and an arc connecting arm 333. The first support arm 331 is connected to the protruding part 31. The second support arm 332 is connected to the fixing column 32. One end of an arc connecting arm 333 is connected to the first support arm 331, and the other end of the arc connecting arm 333 is connected to the second support arm 332. The first support arm 331 and the second support arm 332 are provided in parallel. The fixing column 32 is connected to the free end 212 through the elastic arm 33 and the protruding part 31, both the elastic arm 33 and the protruding part 31 are suspended over the subcavity 15. When the diaphragm sheet 21 is vibrated or deformed by stress, the deformation of diaphragm sheet 21 may be constrained by restraining element 30.

The elastic coefficient of the restraining element 30 can be adjusted through the design of the piezoelectric diaphragm 20, which affects the resonance frequency, sensitivity and bottom noise of the piezoelectric MEMS microphone. When the elastic coefficient of restraint element 30 is increased, the restraint effect is stronger, the resonance frequency will be significantly increased, and the noise will be reduced, but the sensitivity will be reduced. On the contrary, the elastic coefficient is reduced, the constraint effect is weakened, and the resonance frequency is reduced, but the sensitivity is obviously improved. The actual design should be carried out according to the sensitivity, signal to noise ratio and resonance frequency required for the product.

A free end 212 is suspended over each subcavity 15 in this embodiment, and the projection profile of the inner side wall of the ring base 12 in the direction perpendicular to the diaphragm sheet 21 may be circular or polygonal. The number of support beams 14 can be set according to actual needs, and the specific number is not limited. When the projection profile of the inner sidewall of the ring base 12 in the direction perpendicular to the diaphragm sheet 21 is a polygon, the number of support beams 14 may be less than, equal to or greater than the number of vertices of the polygon. It should be noted that, two or more free ends 212 can also be suspended above each sub-cavity 15, and are specifically arranged according to actual design requirements.

As a preferred embodiment, the number of subcavities 15 corresponds to the number of diaphragm sheets 21. The projection profile of the free end 212 in the direction perpendicular to the diaphragm sheet 21 lies within the projection profile of the subcavity 15 in the direction perpendicular to the diaphragm sheet 21. Each subcavity 15 has a corresponding free end 212. Preferably, the projection profile of the free end 212 in the direction perpendicular to the diaphragm sheet 21 is identical in shape to the projection profile of the corresponding subcavity 15 in the direction perpendicular to the diaphragm sheet 21, so that the piezoelectric diaphragm 20 can be overlaid on the cavity 11, avoiding excessive spacing between the piezoelectric diaphragm 20 and the base 10, which will affect the sound effect.

Figure 8:
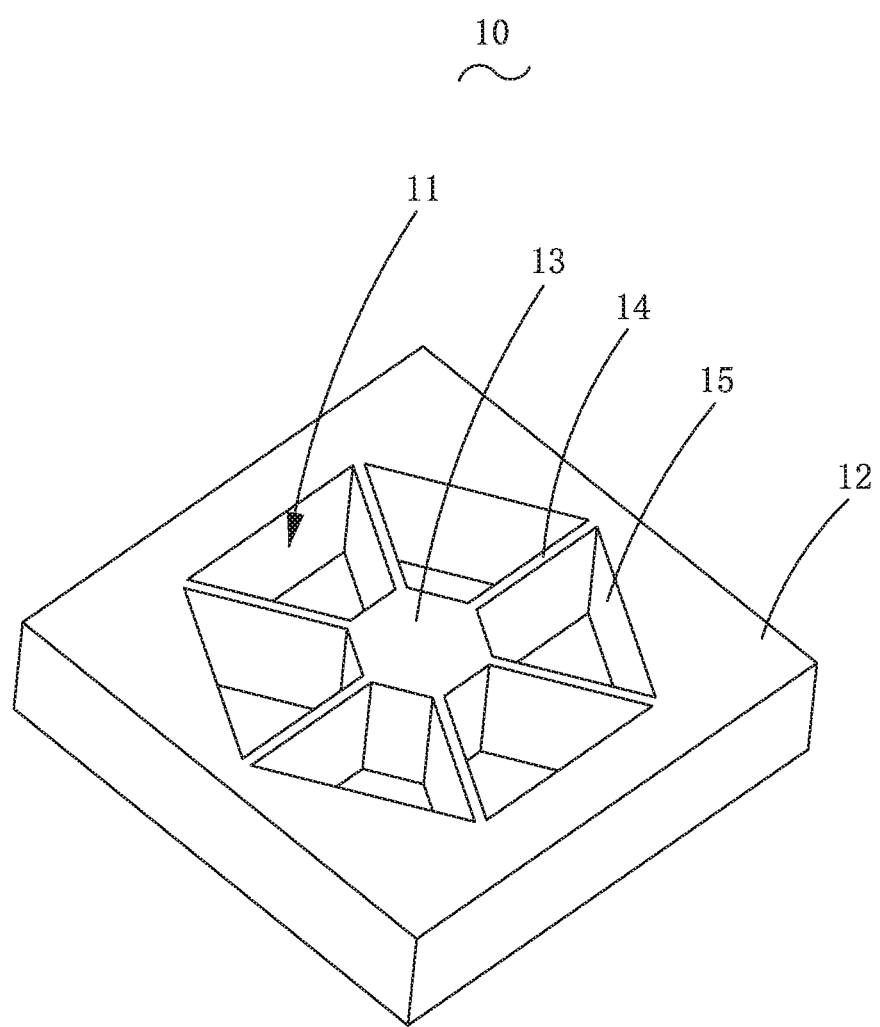
FIG. 8 is an isometric view of a base of the piezoelectric MEMS microphone provided by the embodiment of the present invention.

Referring further to FIG. 8, the inner sidewall of the ring base 12 and the outer sidewall of the support column 13 are polygonal in the direction perpendicular to the diaphragm sheet 21. The projection profile of diaphragm sheet 21 in the direction perpendicular to diaphragm sheet 21 is trapezoidal, and the outer profile of the whole piezoelectric diaphragm 20 is polygonal.

Of course, the shape of the base 10 is not limited to that described above, and the projection profiles of the inner side wall of the ring base 12 and the outer side wall of the support column 13 in the direction perpendicular to the diaphragm sheet 21 in the base 10 may also be circular. The projection profile of the single diaphragm sheet 21 in a direction perpendicular to the diaphragm sheet 21 is fan-shaped.

Alternatively, one of the projection profile of the inner side wall of the ring base 12 in the direction perpendicular to the diaphragm sheet 21 and the projection profile of the outer side wall of the support column 13 in the direction perpendicular to the diaphragm sheet 21 is circular and the other is polygonal.

Several tests shows that the restraining element 30 can effectively release the residual stress formed in the diaphragm sheet 21 during the processing, and the warping deformation of the diaphragm sheet 21 can be well controlled, with the maximum deformation <50 nm. The effect of the deformation on the piezoelectric MEMS microphone attenuation can be neglected.

The specific design of the restraining element 30 is not limited, and any structure that can play the role of elastic connection and restraint is within the scope of this patent.

The number, position and distribution symmetry of the restraint elements 30 are not limited and can be determined by the design of the diaphragm sheet 21 and the parameter requirements of the piezoelectric MEMS microphone. For restraint structures, all designs of free vibration ends of which one ends are connected with the base 10 and the other ends are connected with the diaphragm sheets 21 are within the scope of the invention. The free end 212 may be all edges other than the fixing end 211, including radially extending side edges and circumferentially extending outer peripheries.

The specific structures of the fixing end 211 and the diaphragm sheet 21 are not limited, the symmetry of the overall structure of the piezoelectric diaphragm 20 is not limited either, and the diaphragm sheet 21 may be a symmetric or asymmetric polygon. The side edges of diaphragm sheet 21 may be straight or curved, and the width of free end 212 of the diaphragm sheet 21 larger than the width of the fixing end 211 of the diaphragm sheet 21 is also within the scope of this patent.

It is to be understood, however, that even though numerous characteristics and advantages of the present exemplary embodiment have been set forth in the foregoing description, together with details of the structures and functions of the embodiment, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A piezoelectric MEMS microphone comprising:
a base including a ring base circumferentially forming a cavity;
a piezoelectric diaphragm mounted on the base, comprising a plurality of diaphragm sheets each having a fixing end connected to the support column and a free end suspended over the cavity;
a restraining element connecting the base and the piezoelectric diaphragm;
a support column arranged in the cavity and spaced from the ring base; wherein
the restraining element has one end fixedly connected to the free end, and another end connected to a part of the base that is not connected to the fixing end.

2. The piezoelectric MEMS microphone as described in claim 1, wherein one end of the restraining element has one end fixedly connected to the free end, and another end connected to the ring base.

3. The piezoelectric MEMS microphone as described in claim 1, wherein the base further comprises a plurality of support beams each having one end fixedly connected to the support column and another end connected to the ring base so as to separate the cavity into a plurality of subcavities.

4. The piezoelectric MEMS microphone as described in claim 3, wherein the restraining element has one end fixedly connected to the free end, and another other end connected to the support beam.

5. The piezoelectric MEMS microphone as described in claim 1, wherein the restraining element is a rigid restraining element.

6. The piezoelectric MEMS microphone as described in claim 2, wherein the restraining element is a rigid restraining element.

7. The piezoelectric MEMS microphone as described in claim 3, wherein the restraining element is a rigid restraining element.

8. The piezoelectric MEMS microphone as described in claim 4, wherein the restraining element is a rigid restraining element.

9. The piezoelectric MEMS microphone as described in claim 1, wherein the restraining element is an elastic restraining element; the restraining element comprises an elastic arm, a protruding part connected to the diaphragm sheet and a fixing column connected to the base; the elastic arm has one end connected to the protruding part, the other end connected to the fixing column.

10. The piezoelectric MEMS microphone as described in claim 2, wherein the restraining element is an elastic restraining element; the restraining element comprises an elastic arm, a protruding part connected to the diaphragm sheet and a fixing column connected to the base; the elastic arm has one end connected to the protruding part, the other end connected to the fixing column.

11. The piezoelectric MEMS microphone as described in claim 3, wherein the restraining element is an elastic restraining element; the restraining element comprises an elastic arm, a protruding part connected to the diaphragm sheet and a fixing column connected to the base; the elastic arm has one end connected to the protruding part, the other end connected to the fixing column.

12. The piezoelectric MEMS microphone as described in claim 4, wherein the restraining element is an elastic restraining element; the restraining element comprises an elastic arm, a protruding part connected to the diaphragm sheet and a fixing column connected to the base; the elastic arm has one end connected to the protruding part, the other end connected to the fixing column.

13. The piezoelectric MEMS microphone as described in claim 1, wherein the elastic arm comprises an arc connecting arm, a first support arm connected to the protruding part and a second support arm connected to the fixing column; the arc connecting arm has one end connected to the first support arm, the other end connected to the second support arm.

14. The piezoelectric MEMS microphone as described in claim 2, wherein the elastic arm comprises an arc connecting arm, a first support arm connected to the protruding part and a second support arm connected to the fixing column; the arc connecting arm has one end connected to the first support arm, the other end connected to the second support arm.

15. The piezoelectric MEMS microphone as described in claim 3, wherein the elastic arm comprises an arc connecting arm, a first support arm connected to the protruding part and a second support arm connected to the fixing column; the arc connecting arm has one end connected to the first support arm, the other end connected to the second support arm.

16. The piezoelectric MEMS microphone as described in claim 4, wherein the elastic arm comprises an arc connecting arm, a first support arm connected to the protruding part and a second support arm connected to the fixing column; the arc connecting arm has one end connected to the first support arm, the other end connected to the second support arm.

17. The piezoelectric MEMS microphone as described in claim 1, wherein each of the diaphragm sheets connects two of the restraining elements, the two ends of the diaphragm sheet facing the ring base side are respectively provided with the restraining element.

18. The piezoelectric MEMS microphone as described in claim 3, wherein a projection profile of the free end in a direction perpendicular to the diaphragm sheet is located within a projection profile of the subcavity in a direction perpendicular to the diaphragm sheet.

19. The piezoelectric MEMS microphone as described in claim 3, wherein the projection profile of the free end in the direction perpendicular to the diaphragm sheet is the same as the projection profile shape of the corresponding subcavity in the direction perpendicular to the diaphragm sheet.

* * * * *